United States Patent
Ko

(10) Patent No.: US 8,824,219 B2
(45) Date of Patent: Sep. 2, 2014

(54) POWER SOURCE CIRCUIT AND SEMICONDUCTOR MEMORY CIRCUIT USING THE SAME

(75) Inventor: Young Jo Ko, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 342 days.

(21) Appl. No.: 12/840,223

(22) Filed: Jul. 20, 2010

(65) Prior Publication Data

US 2011/0128798 A1 Jun. 2, 2011

(30) Foreign Application Priority Data

Nov. 30, 2009 (KR) .................. 10-2009-0117235

(51) Int. Cl.
*G11C 5/14* (2006.01)
*G11C 29/00* (2006.01)

(52) U.S. Cl.
CPC . *G11C 29/83* (2013.01); *G11C 5/14* (2013.01)
USPC ...... 365/189.09; 365/222; 365/226; 365/227; 365/236; 327/544

(58) Field of Classification Search
USPC ........... 365/222, 226, 227, 228, 236; 327/544
See application file for complete search history.

(56) References Cited

U.S. PATENT DOCUMENTS

| | | | |
|---|---|---|---|
| 5,771,199 A | 6/1998 | Lee | |
| 5,848,021 A * | 12/1998 | Sugibayashi | 365/230.06 |
| 5,889,719 A * | 3/1999 | Yoo et al. | 365/226 |
| 6,310,816 B2 | 10/2001 | Manning | |
| 6,414,868 B1 | 7/2002 | Wong et al. | |
| 7,319,631 B2 * | 1/2008 | Cho | 365/230.03 |
| 2008/0170446 A1* | 7/2008 | Kwon et al. | 365/189.09 |
| 2009/0185436 A1* | 7/2009 | Kim | 365/189.16 |

FOREIGN PATENT DOCUMENTS

| | | |
|---|---|---|
| JP | 2005-056529 | 3/2005 |
| KR | 100757928 B1 | 9/2007 |
| KR | 1020080111733 A | 12/2008 |

* cited by examiner

*Primary Examiner* — Tha-O H Bui
(74) *Attorney, Agent, or Firm* — William Park & Associates Ltd.

(57) ABSTRACT

A semiconductor memory circuit includes: a plurality of memory regions; a plurality of driving units configured to be enabled in response to a plurality of enable signals, respectively, and generate a predetermined voltage used for operations of the plurality of memory regions; and an enable control unit configured to count a control pulse and activate one or more enable signals among the plurality of enable signals.

12 Claims, 6 Drawing Sheets

FIG.7

| Input Number of TM | 110 | 120 | 130 | 140 |
|---|---|---|---|---|
| 0 | On | On | On | On |
| 1 | Off | On | On | On |
| 2 | On | Off | On | On |
| 3 | Off | Off | On | On |
| 4 | On | On | Off | On |
| 5 | Off | On | Off | On |
| 6 | On | Off | Off | On |
| 7 | Off | Off | Off | On |
| 8 | On | On | On | Off |
| 9 | Off | On | On | Off |
| 10 | On | Off | On | Off |
| 11 | Off | Off | On | Off |
| 12 | On | On | Off | Off |
| 13 | Off | On | Off | Off |
| 14 | On | Off | Off | Off |
| 15 | Off | Off | Off | Off | ns
POWER SOURCE CIRCUIT AND SEMICONDUCTOR MEMORY CIRCUIT USING THE SAME

CROSS-REFERENCES TO RELATED APPLICATION

The present application claims priority under 35 U.S.C. §119(a) to Korean application number 10-2009-0117235, filed on Nov. 30, 2009, in the Korean Intellectual Property Office, which is incorporated herein by reference in its entirety as if set forth in full.

BACKGROUND

1. Technical Field

The present invention relates to a semiconductor circuit, and more particularly, to a power source circuit and a semiconductor memory circuit using the same.

2. Related Art

FIG. 1 is a block diagram of a typical semiconductor memory circuit. Hereinafter, for the sake of convenience, a typical semiconductor memory circuit 10 having a 2-GB memory capacity will be explained as an example.

As illustrated in FIG. 1, the semiconductor memory circuit 10 is illustrated to have a total of 2-GB memory: a 1-GB memory is implemented by sixteen upper memory regions and a 1-GB memory is implemented by sixteen lower memory regions, when viewed from the center of the semiconductor memory circuit 10.

The semiconductor memory circuit 10 includes a plurality of memory regions (thirty-two memory regions) 64M_R and 64M_L, and four drivers 11 through 14 which generate a core voltage (VCORE) for defining data levels of memory cells included in the memory regions 64M_R and 64M_L.

The plurality of drivers (four drivers) 11 through 14 which generate the core voltage (VCORE) are provided in order to stably supply an amount of electric current necessary for the 2-GB memory.

The number of the drivers may be changed, depending on a circuit design or a memory capacity.

The plurality of drivers 11 through 14 consume electric current constantly for their operations right after the supply of the power to the semiconductor memory circuit.

The semiconductor memory circuit is manufactured on a wafer in a chip type, and whether a corresponding chip is usable is verified through various tests.

When any of the memory regions is failed due to process parameters or foreign particles, the failed memory region is replaced with redundancy cells.

As such, when all fails are replaceable with redundancy cells, the chip may be packaged as a 2-GB memory and shipped out.

Meanwhile, when many fails occur in a chip so that they may not be replaced with the redundancy cells, the corresponding chip is discarded.

However, in some cases, the fails in the upper 1-GB memory region of FIG. 1 may not be replaced with the redundancy cells while the fails in the lower 1-GB memory region may be replaced with the redundancy cells.

In those cases, the chip may be packaged as a 1-GB memory using only the lower 1-GB memory region and then shipped out.

In case of the 1-GB memory, a necessary electric current may be sufficiently supplied by only a small number of drivers, for example, two drivers.

However, even when the chip is packaged as the 1-GB memory, the four drivers 11 through 14 are included inside the chip, and the four drivers 11 through 14 consume electric current constantly for their operations right after the supply of the power to the semiconductor memory circuit.

Therefore, the typical semiconductor memory circuit may have a problem in that an amount electric current consumption is increased by the operation of unnecessary drivers, which is inappropriate for the memory capacity.

SUMMARY

In one embodiment of the present invention, a power source circuit includes: a plurality of driving units configured to generate a predetermined voltage, wherein the number of driving units enabled among the plurality of driving units is changed, depending on the number of inputs of a control pulse.

In another embodiment of the present invention, a semiconductor memory circuit includes: a plurality of memory regions; a plurality of driving units configured to be enabled in response to a plurality of enable signals, respectively, and generate a predetermined voltage used for operations of the plurality of memory regions; and an enable control unit configured to count a control pulse and activate one or more enable signals among the plurality of enable signals.

BRIEF DESCRIPTION OF THE DRAWINGS

Features, aspects, and embodiments are described in conjunction with the attached drawings, in which:

FIG. 7 is a table explaining the enabling of the driving units, depending on the number of inputs of a control pulse, according to an embodiment of the present invention.

DETAILED DESCRIPTION

Hereinafter, a clock signal duty correction circuit according to the present invention will be described below with reference to the accompanying drawings through exemplary embodiments.

For the sake of convenience, a semiconductor memory circuit 100 according to an embodiment of the present invention, which has a 2-GB memory capacity, will be described as an example.

Figure 1:
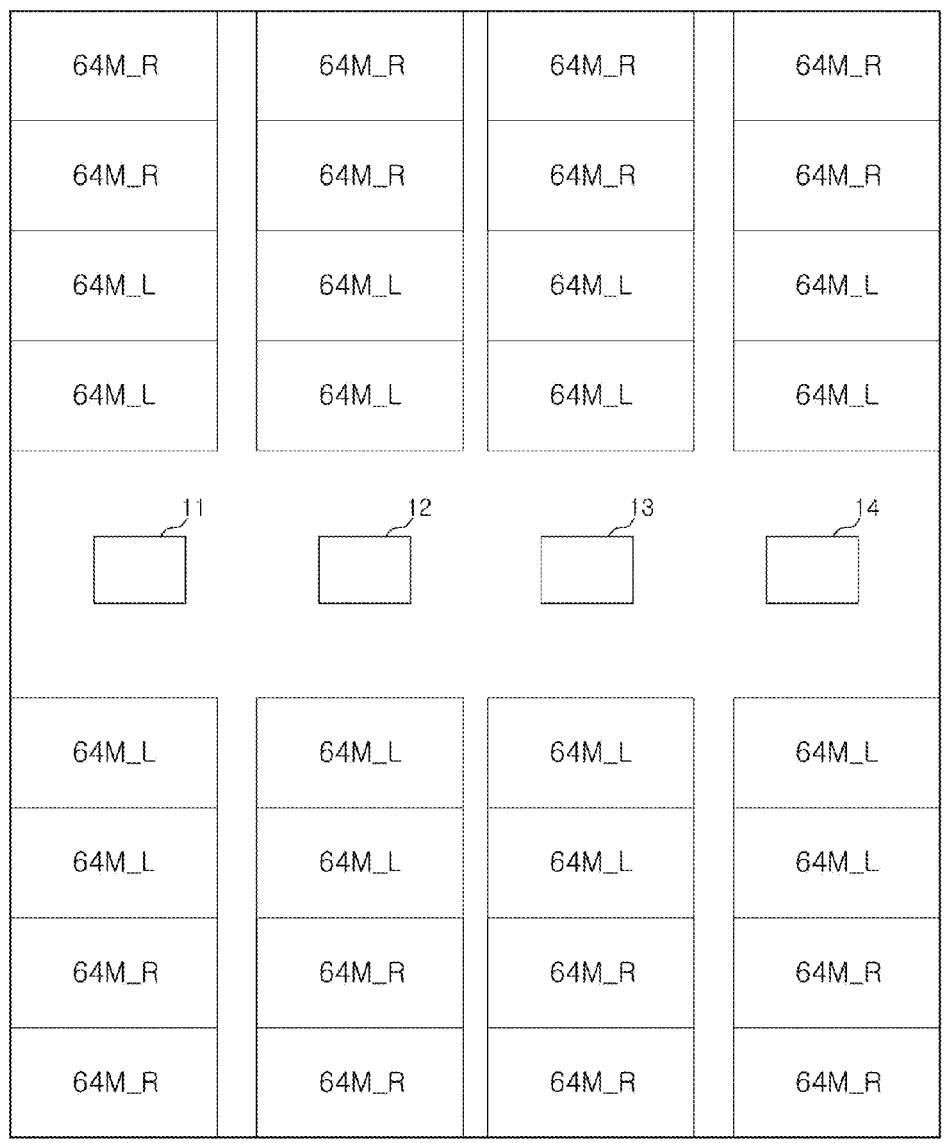
FIG. 1 is a block diagram of a typical semiconductor memory circuit.
Figure 2:
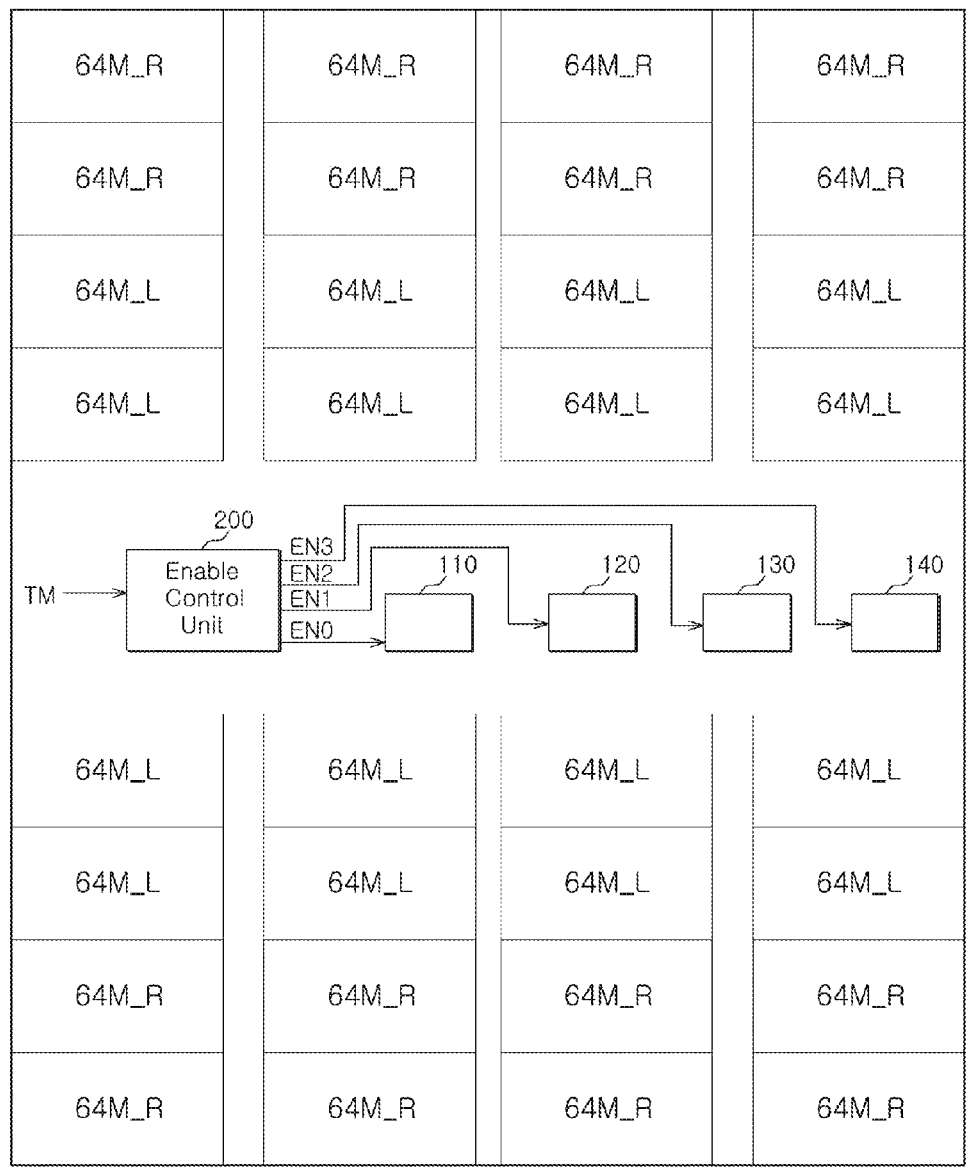
FIG. 2 is a block diagram of a semiconductor memory circuit according to an embodiment of the present invention.

FIG. 2 is a block diagram of a semiconductor memory circuit according to an embodiment of the present invention. As illustrated in FIG. 2, the semiconductor memory circuit 100 according to the embodiment of the present invention is configured to have a total 2-GB memory by a plurality of memory regions 64M_R and 64M_L.

That is, a 1-GB memory is implemented by sixteen upper memory regions and a 1-GB memory is implemented by sixteen lower memory regions, when viewed from the center of the semiconductor memory circuit 100.

An enable control unit 200 and a plurality of driving units, that is, first through fourth driving units 110 through 140, are arranged between the upper memory regions and the lower memory regions. The person skilled in the art would appreciate that the arrangement of the enable control unit 200 and the first through fourth driving units 110 through 140 may be changed, depending on a circuit design.

The first through fourth driving units 110 through 140 are configured to be enabled in response to a plurality of enable signals, that is, first through fourth enable signals EN0 through EN3.

Each of the first through fourth driving units 110 through 140, when it is enabled, is configured to generate a predetermined voltage, for example, a core voltage (VCORE) for defining data levels of memory cells, which is necessary for the operations of the plurality of memory regions 64M_R and 64M_L.

The enable control unit 200 is configured to count a control pulse TM and vary the number of enable signals activated among the first through fourth enable signals EN0 through EN3.

At this time, the control pulse TM may use a test mode signal.

Figure 3:
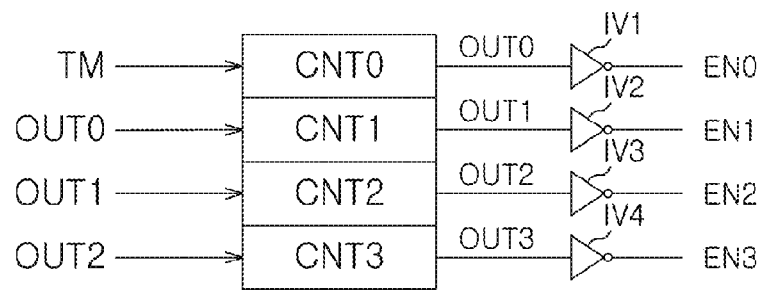
FIG. 3 is a block diagram illustrating an internal configuration of an enable control unit of FIG. 2.

FIG. 3 is a block diagram illustrating an internal configuration of the enable control unit 200 shown in FIG. 2. As illustrated in FIG. 3, the enable control unit 200 includes first through fourth counters CNT0 through CNT3, and first through fourth inverters IV1 through IV4.

The first counter CNT0 is configured to count the control pulse TM and generate a first count signal OUT0. The first count signal OUT0 is inverted by the first inverter IV1 and then outputted as the first enable signal EN0.

The second through fourth counters CNT1 through CNT3 are configured to count output signals of their previous counters, that is, the first through third count signals CNT0 through CNT2, and generate second through fourth count signals CNT1 through CNT3, respectively. The second through fourth count signals CNT1 through CNT3 are inverted by the second through fourth inverters IV2 through IV4 and then outputted as the second through fourth enable signals EN1 through EN3, respectively.

The first through fourth counters CNT0 through CNT3 are configured to detect falling edges of their input signals and change levels of their output signals.

For example, the first counter CNT0 is configured to detect a falling edge of the control pulse TM and changes a level of the first count signal OUT0.

Figure 4:
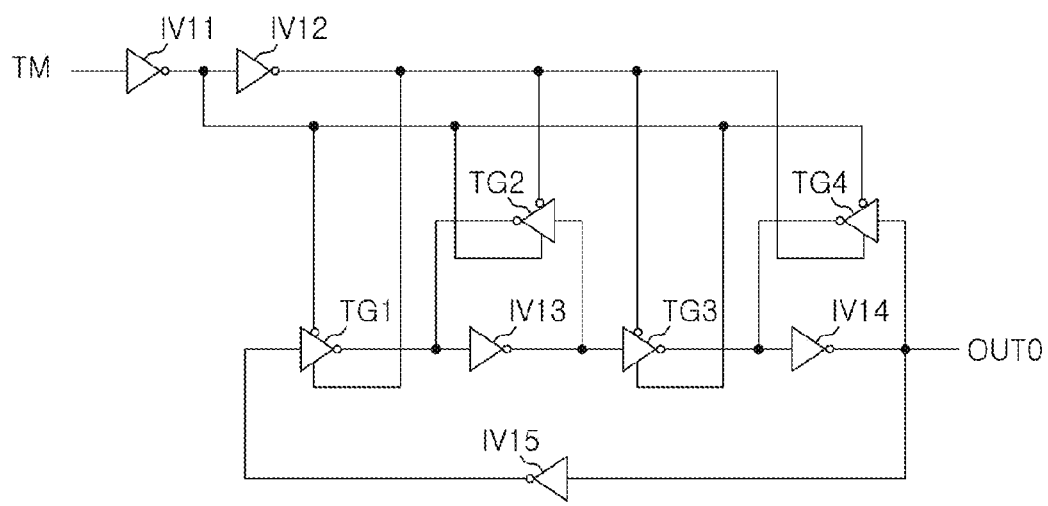
FIG. 4 is a circuit diagram of a first counter of FIG. 3.

FIG. 4 is a circuit diagram of a first counter shown in FIG. 3. As illustrated in FIG. 4, the first counter CNT0 includes a plurality of inverters IV11 through IV15 and a plurality of transfer gates TG1 through TG4.

The second through fourth counters CNT0 through CNT3 may be implemented in a substantially identical configuration to that of the first counter CNT0.

Figure 5:
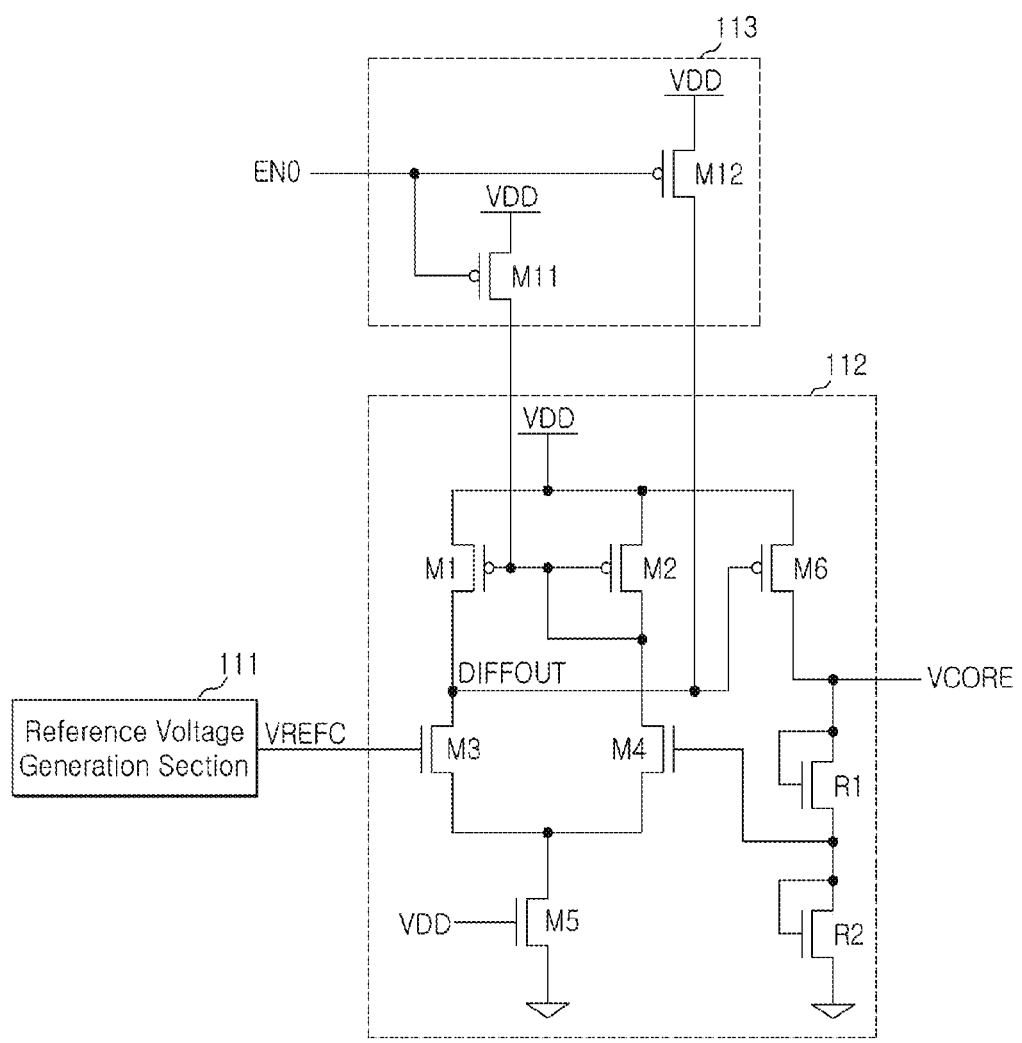
FIG. 5 is a circuit diagram of a first driving unit of FIG. 2.

FIG. 5 is a circuit diagram of a first driving unit of FIG. 2. As illustrated in FIG. 5, the first driving unit 110 includes a reference voltage generation section 111, a differential amplification section 112, and a switching section 113. The reference voltage generation section 111 is configured to generate a reference voltage VREFC used for generating the core voltage VCORE. The differential amplification section 112 is configured to generate the core voltage VCORE by using the reference voltage VREFC. The switching section 113 is configured to enable the differential amplification section 112 in response to the first enable signal EN0.

The differential amplification section 112 includes a plurality of transistors M1 through M6 and a plurality of resistors R1 and R2. In this case, a differential amplification circuit is implemented by the plurality of transistors M1 through M5.

The transistor M6 is configured to generate the core voltage VCORE by adjusting an amount of electric current flowing through the plurality of resistors R1 and R2 to the ground terminal based on a differential amplification signal DIFFOUT outputted from the differential amplification circuit. In addition, the differential amplification circuit adjusts a signal level of the differential amplification signal DIFFOUT by using the core voltage VCORE divided by the plurality of resistors R1 and R2 in order to maintain the core voltage VCORE at a constant level.

The switching section 113 includes a plurality of transistors M11 and M12. When the first enable signal EN0 is activated to a high level, the plurality of transistors M11 and M12 enable the differential amplification section 112.

Meanwhile, when the first enable signal EN0 is deactivated to a low level, the switching unit 113 disables the differential amplification section 112 by turning off the transistors M1, M2 and M6 of the differential amplification section 112.

Consequently, when the first enable signal EN0 is deactivated, the first driving unit 110 is disabled.

The second through fourth driving units 120 through 140 may be implemented in a substantially identical configuration to that of the first driving unit 110.

The operation of the semiconductor memory circuit 100 according to the embodiment of the present invention, which has the above-described configuration, will be explained below.

The semiconductor memory circuit 100 according to the embodiment of the present invention may selectively enable one or more driving units among the first through fourth driving units 110 through 140, depending on the number of inputs of the control pulse TM. It is apparent that all of the first through fourth driving units 110 through 140 may be disabled or enabled.

Figure 6:
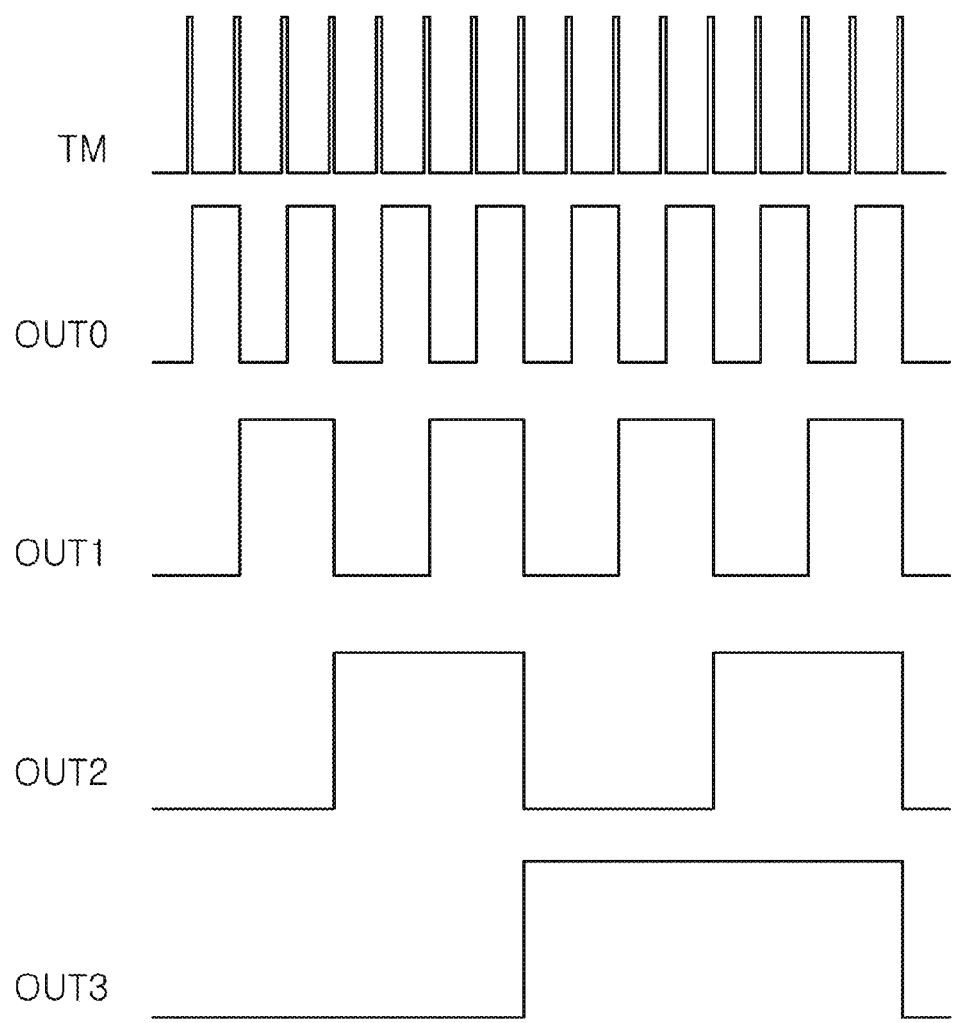
FIG. 6 is a waveform diagram showing output signals of first through fourth counters.

FIG. 6 is a waveform diagram showing output signals of first through fourth counters. Referring to FIG. 6, when the control pulse TM is not inputted, all of the first through fourth count signals OUT0 through OUT3 are at a low level.

Therefore, all of the first through fourth enable signals EN0 through EN3 become a high level (see FIG. 3).

Since all of the first through fourth enable signals EN0 through EN3 are at a high level, all of the first through fourth driving units 110 through 140 are enabled to perform the operation of generating the core voltage VCORE (see FIG. 5).

Then, when the control pulse TM is inputted once, the first count signal OUT0 becomes a high level, and the second through fourth count signals OUT1 through OUT3 become a low level.

Therefore, the first enable signal EN0 becomes a low level, and the second through fourth enable signals EN1 through EN3 become a high level (see FIG. 3).

Since the first enable signal EN0 is at a low level and the second through fourth enable signals EN1 through EN3 are at a high level, the first driving unit 110 is disabled, and the second through fourth driving units 110 through 140 are enabled to perform the operation of generating the core voltage VCORE (see FIG. 5). That is, the generation of the core voltage VCORE is achieved by the second through fourth driving units 110 through 140.

FIG. 7 is a table explaining the enabling of the driving units, depending on the number of inputs of a control pulse, according to an embodiment of the present invention. As illustrated in FIG. 7, the driving units and the number of the driving units enabled among the first through fourth driving units 110 through 140 are changed, depending on the number of inputs of the control pulse TM.

When the control pulse TM is inputted 15 times, all of the first through fourth count signals OUT0 through OUT3 become a high level.

Therefore, all of the first through fourth enable signals EN0 through EN3 become a low level (see FIG. 3).

Since all of the first through fourth enable signals EN0 through EN3 are at a low level, all of the first through fourth driving units 110 through 140 are disabled (see FIG. 5).

As described above, the semiconductor memory circuit 100 according to the embodiment of the present invention may select the driving units located at desired positions and determine the number of the driving units among the plurality of driving units which generate the core voltage VCORE.

Therefore, it is possible to substantially prevent unnecessary electric current consumption by operating an appropriate number of the driving units suitable for the memory capacitor.

While certain embodiments have been described above, it will be understood to those skilled in the art that the embodiments described are by way of example only. Accordingly, the clock signal duty correction circuit described herein should not be limited based on the described embodiments. Rather, the clock signal duty correction circuit described herein should only be limited in light of the claims that follow when taken in conjunction with the above description and accompanying drawings.

What is claimed is:

1. A power source circuit comprising:
   a plurality of driving units each of which is configured to generate a power source voltage,
   wherein any desired positions and any desired numbers of enabled driving units and disabled driving units among the plurality of driving units can be changed by control a number of times of inputting a control pulse,
   wherein the plurality of driving units are configured to be enabled in response to a plurality of enable signals, respectively, and
   wherein each of the plurality of driving units comprises:
   a reference voltage generation section configured to generate a reference voltage used for generating the power source voltage;
   a differential amplification section configured to generate the power source voltage by using the reference voltage; and
   a switching section configured to enable the differential amplification section in response to any one of the plurality of enable signals.

2. The power source circuit according to claim 1, wherein the plurality of driving units are enabled when the control pulse is not inputted.

3. The power source circuit according to claim 1, wherein the plurality of driving units are disabled when the control pulse is inputted as many as a predetermined number of times.

4. The power source circuit according to claim 1, further comprising an enable control unit configured to count the control pulse and activate one or more enable signals among the plurality of enable signals.

5. The power source circuit according to claim 4, wherein the enable control unit comprises:
   a first counter configured to count the control pulse and generate a first enable signal; and
   a second counter configured to count the first enable signal and generate a second enable signal.

6. The power source circuit according to claim 1, wherein the control pulse is test mode signal.

7. A semiconductor memory circuit comprising:
   a plurality of memory regions;
   a plurality of driving units each of which is configured to be enabled in response to a plurality of enable signals, and generate a power source voltage used for operations of the corresponding memory region; and
   an enable control unit configured to count a control pulse and generate the plurality of enable signals,
   wherein the enable control unit is configured to change any desired positions and any desired numbers of enabled driving units and disabled driving units among the plurality of driving units by generating the plurality of enable signals in response to a number of times of inputting the control pulse,
   wherein each of the plurality of driving units comprises:
   a reference voltage generation section configured to generate a reference voltage used for generating the power source voltage;
   a differential amplification section configured to generate the power source by using the reference voltage; and
   a switching section configured to enable the differential amplification section in response to any one of the plurality of enable signals.

8. The semiconductor memory circuit according to claim 7, wherein the power source voltage is a voltage used for defining data levels of the plurality of memory regions.

9. The semiconductor memory circuit according to claim 7, wherein the plurality of driving units are enabled when the control pulse is not inputted.

10. The semiconductor memory circuit according to claim 7, wherein the plurality of driving units are disabled when the control pulse is inputted as many as a predetermined number of times.

11. The semiconductor memory circuit according to claim 7, wherein the enable control unit comprises:
    a first counter configured to count the control pulse and generate a first enable signal; and
    a second counter configured to count the first enable signal and generate a second enable signal.

12. The semiconductor memory circuit according to claim 7, wherein the control pulse is test mode signal.

* * * * *